United States Patent [19]
Suzuki

[11] Patent Number: 6,107,197
[45] Date of Patent: Aug. 22, 2000

[54] METHOD OF REMOVING A CARBON-CONTAMINATED LAYER FROM A SILICON SUBSTRATE SURFACE FOR SUBSEQUENT SELECTIVE SILICON EPITAXIAL GROWTH THEREON AND APPARATUS FOR SELECTIVE SILICON EPITAXIAL GROWTH

[75] Inventor: Tatsuya Suzuki, Tokyo, Japan

[73] Assignee: NEC Corporation, Tokyo, Japan

[21] Appl. No.: 08/781,821

[22] Filed: Jan. 10, 1997

[30] Foreign Application Priority Data

Jan. 10, 1996  [JP]  Japan ................................. 8-002107

[51] Int. Cl.$^7$ ................................................. C30B 25/04
[52] U.S. Cl. ......................... 438/677; 438/680; 438/719; 438/725; 438/906; 117/90; 117/92; 117/97; 216/64; 216/67; 216/79; 216/81
[58] Field of Search .................................. 117/97, 90, 92; 438/677, 680, 906, 725, 974, 719; 134/1.2; 216/64, 67, 81, 79; 427/534, 533, 307

[56] References Cited

U.S. PATENT DOCUMENTS

| | | | |
|---|---|---|---|
| 4,605,479 | 8/1986 | Faith | 204/192 |
| 5,017,264 | 5/1991 | Yamazaki | 156/643 |
| 5,229,334 | 7/1993 | Kato | 437/239 |
| 5,290,361 | 3/1994 | Hayashida | 134/2 |
| 5,300,187 | 4/1994 | Lesk | 156/628 |
| 5,350,480 | 9/1994 | Gary . | |
| 5,352,327 | 10/1994 | Witowski . | |
| 5,352,636 | 10/1994 | Beinglass | 437/235 |
| 5,403,434 | 4/1995 | Moslehi | 156/643 |
| 5,443,033 | 8/1995 | Nishizawa | 117/86 |

FOREIGN PATENT DOCUMENTS

| | | |
|---|---|---|
| 62-136814 | 6/1987 | Japan . |
| 2-89313 | 3/1990 | Japan . |
| 4-235282 | 8/1992 | Japan . |
| 4-333223 | 11/1992 | Japan . |
| 5-259091 | 10/1993 | Japan . |
| 7-142393 | 6/1995 | Japan . |

OTHER PUBLICATIONS

Rinshi Sugino et al., "Characterization of Si–SiO2 Interfaces Formed after Photo–Excited Cleaning", pp. 417–420, Japanese Journal of Applied Physics, Aug. 28, 1989.

Yasuhira Sato et al., "Photoexcited Processes for Semiconductors II: Dry Cleaning and Dry Etching", pp. 317–328, Fujitsu–Scientific and Technical Journal, vol. 27, No. 4, Dec. 1, 1991.

B. Anthony, et al., "In situ cleaning of silicon substrate surfaces by remote plasma–excited hydrogen", pp. 621–626, Journal of Vacuum Science and Technology Part B, vol. 7, No. 4, Jul./Aug. 1, 1989.

Kiyoshi Asakawa et al., "GaAs Reactive Ion Beam Etching and Surface Cleaning Using Enclosed Ultrahigh–Vacuum Processing System", pp. 1–13, NEC Research and Development, No. 87, Oct. 1, 1987.

*Primary Examiner*—Robert Kunemund
*Attorney, Agent, or Firm*—Young & Thompson

[57] ABSTRACT

A method of removing a carbon-contaminated layer from a silicon substrate surface before a silicon epitaxial growth on the silicon substrate surface. A carbon-contaminated layer on the silicon substrate is exposed to a chlorine radical to cause a chemical reaction of the chlorine radical with carbon atoms of the carbon-contaminated layer to generate chlorine carbide to form chlorine carbide for removal of the carbon-contaminated layer from the silicon substrate surface, wherein the chlorine radical has been generated by passing a chlorine gas through a heating filament so that the chlorine radical is generated at a much higher generation efficiency than when the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

55 Claims, 9 Drawing Sheets

METHOD OF REMOVING A CARBON-CONTAMINATED LAYER FROM A SILICON SUBSTRATE SURFACE FOR SUBSEQUENT SELECTIVE SILICON EPITAXIAL GROWTH THEREON AND APPARATUS FOR SELECTIVE SILICON EPITAXIAL GROWTH

BACKGROUND OF THE INVENTION

The present invention relates to a method of epitaxial growth of a silicon layer on a silicon substrate and an apparatus therefor, and more particularly to a method of removal of a carbon-contaminated layer from a silicon substrate surface for subsequent selective silicon epitaxial growth on the silicon substrate surface and an apparatus therefor.

FIG. 1 is a schematic diagram illustrative of a structure of the conventional silicon epitaxial growth system provided with a deep ultraviolet ray generator for generating chlorine radicals to remove carbon contamination. The silicon epitaxial growth system comprises the following elements. A growth chamber 2 is adopted for accommodating a silicon substrate 1 and epitaxially growing a silicon layer on the silicon substrate 1. A heater chamber 3 is provided adjacent to the growth chamber 2 so that the heater chamber 3 is positioned under the silicon substrate 1, whilst the growth chamber 2 is positioned over the silicon substrate 1. Namely, the heater chamber 3 is separated by the silicon substrate 1 from the growth chamber 2. In the heater chamber 3, a substrate heater 4 serving as a substrate temperature controller is provided for controlling a temperature of the silicon substrate 1 or heating up the silicon substrate 1. In the growth chamber 2, the silicon substrate 1 is supported by a suscepter 5. A pair of turbo molecular pumps 6 are provided which are coupled with the growth chamber 2 and the heater chamber 3 respectively for differential discharge. A silane system gas feeding tube 9 is provided to be connected to the growth chamber 2 for supplying a silane system gas such as a silane gas and a disilane gas into the growth chamber 2 for epitaxial growth of the silicon layer on the silicon substrate 1. A chlorine radical generator is furthermore provided to be connected to the growth chamber 2 for generating a chlorine radical and supplying the chlorine radical onto the silicon substrate 1 in the growth chamber 2. The chlorine radical generator comprises a chlorine gas feeding tube 10, through which a chlorine gas is fed, a deep ultraviolet ray generator 17 provided on a side wall of the growth chamber 2. The level in position of the deep ultraviolet ray generator 17 is higher than the level of the silicon substrate 1 and lower than the level of the chlorine gas feeding tube 10 so that the deep ultraviolet ray generator 17 generates a deep ultraviolet ray to be irradiated to the chlorine gas fed from the chlorine gas feeding tube 10 whereby the chlorine gas is made into chlorine radical but at a lower efficiency. On the other hand, the silane system gas feeding tube 9 is provided at an oblique angle to the surface of the silicon substrate 1 so that the silane system gas is injected into the growth chamber 2 at the oblique angle to the surface of the silicon substrate 1. The above device is disclosed in the Japanese laid-open patent publication No. 63-237419.

The chlorine radical is irradiated to the silicon substrate surface to remove a carbon-contamination from the silicon substrate surface. Notwithstanding, actuary, carbon resides on the silicon substrate surface 1 at a certain high sheet concentration in the order of $1 \times 10^{14}/cm^2$ because when the deep ultraviolet ray is used to generate chlorine radical, generation efficiency of the chlorine radical is too low, for example, not more than 0.5%, resulting in a too small an amount of the generated chlorine radical to be irradiated onto the carbon-contamination on the silicon substrate surface. This results in a too low etching rate of etching the carbon-contaminated layer over the silicon substrate surface.

If in order to increase the etching rate or obtain a sufficient amount of the chlorine radical, it is required to increase the chlorine gas pressure up to 0.1 torr or more. The above silicon epitaxial growth system is designed so that a background pressure in no gas flow condition is in the range of $1 \times 10^{-9} - 1 \times 10^{-10}$ torr whilst an operational gas pressure in a certain gas flow condition is not more than $5 \times 10^{14}$ torr. If the gas pressure were greater than the above maximum values, then the system will receive a considerable load resulting in shortening its life-time. Namely, the maximum gas pressure of $5 \times 10^{-14}$ torr is insufficient to obtain the necessary amount of the chlorine radical to completely remove the carbon-contaminated layer from the silicon substrate surface.

In the above circumstances, it had been required to develop a novel method and an apparatus for removing the carbon-contaminated layer from the silicon substrate surface without, however, raising the above problems.

SUMMARY OF THE INVENTION

Accordingly, it is an object of the present invention to provide a novel method of removing a carbon-contaminated layer from a silicon substrate surface before a silicon epitaxial growth on the silicon substrate surface, which is free from any problems and disadvantages as described above.

It is another object of the present invention to provide a method of epitaxially growing a silicon layer on a silicon substrate surface, which is free from any problems and disadvantages as described above.

It is still another object of the present invention to provide an apparatus for epitaxially growing a silicon layer on a silicon substrate, which is free from any problems and disadvantages as described above.

The above and other objects, features and advantages of the present invention will be apparent from the following descriptions.

The first present invention relates to a method of removing a carbon-contaminated layer from a silicon substrate surface before a silicon epitaxial growth on the silicon substrate surface. A carbon-contaminated layer on the silicon substrate is exposed to a chlorine radical to cause a chemical reaction of the chlorine radical with carbon atoms of the carbon-contaminated layer to generate chlorine carbide to form chlorine carbide for removal of the carbon-contaminated layer from the silicon substrate surface, wherein the chlorine radical has been generated by passing a chlorine gas through a heating filament so that the chlorine radical is generated at a much higher generation efficiency than when the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed Therefrom at a higher efficiency. The epitaxial growth of the silicon layer on the carbon-free or carbon pile-up free silicon substrate surface results in the epitaxial silicon layer having a high crystal quality or crystal perfection.

The second present invention provides a method of removing a carbon-contaminated layer from a silicon substrate surface before a silicon epitaxial growth on the silicon substrate surface. A carbon-contaminated layer on the silicon substrate surface is exposed to a hydrogen radical to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by the subsequent silicon epitaxial growth, wherein the hydrogen radical has been generated by passing a hydrogen gas through a heating filament so that the hydrogen radical is generated at a much higher generation efficiency than if the hydrogen radical were generated by using a deep ultraviolet ray. This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

The third present invention provides a method of removing a carbon-contaminated layer from a silicon substrate surface for subsequent silicon epitaxial growth on the silicon substrate surface. A carbon-contaminated layer on the silicon substrate surface is exposed to a chlorine radical, wherein a temperature of the silicon substrate surface is maintained to be not more than 800° C., to cause a reaction of the chlorine radical with carbon atoms of the carbon-contaminated layer to form chlorine carbide for removal of the carbon-contaminated layer from the silicon substrate surface. This means it possible to remove carbon or the carbon-contaminated layer from the silicon substrate surface at such desirable low temperature. The epitaxial growth of the silicon layer on the carbon-free or carbon pile-up free silicon substrate surface results in the epitaxial silicon layer having a high crystal quality or crystal perfection.

The fourth present invention provides a method of removing a carbon-contaminated layer from a silicon substrate surface for subsequent silicon epitaxial growth on the silicon substrate surface. A carbon-contaminated layer on the silicon substrate surface is exposed to a hydrogen radical, wherein a temperature of the silicon substrate surface is maintained to be not more than 800° C., to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by the subsequent silicon epitaxial growth. This means it possible to remove carbon or the carbon-contaminated layer from the silicon substrate surface at such desirable low temperature. The epitaxial growth of the silicon layer on the carbon-free or carbon pile-up free silicon substrate surface results in the epitaxial silicon layer having a high crystal quality or crystal perfection.

The fifth present invention provides a method of epitaxially growing a silicon layer on a silicon substrate surface. The silicon substrate surface is cleaned with a first chemical including ammonia, hydrogen peroxide and water to remove organic substances and particles from the silicon substrate surface. The silicon substrate surface is further cleaned with a second chemical including hydrochloric acid, hydrogen peroxide and water to remove heavy metals. The silicon substrate surface is furthermore cleaned with a diluted hydrofluoric acid solution to remove a spontaneous oxide layer from the silicon substrate surface. A carbon-contaminated layer on the silicon substrate surface is exposed to a chlorine radical, wherein a temperature of the silicon substrate surface is maintained to be not more than 800° C., to cause a reaction of the chlorine radical with carbon atoms of the carbon-contaminated layer to form chlorine carbide for removal of the carbon-contaminated layer from the silicon substrate surface This means it possible to remove carbon or the carbon-contaminated layer from the silicon substrate surface at such desirable low temperature. Further, the chlorine radical has been generated by passing a chlorine gas through a filament heated up so that the chlorine radical is generated at a much higher generation efficiency than if the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency. The silicon substrate surface is heated up to a temperature of more than about 800° C. to eliminate residual chlorine from the silicon substrate surface. The silicon substrate surface is cooled down to a temperature of about 650° C. A silicon layer is epitaxially grown on the silicon substrate surface by use of a silane system gas including a silane gas and a disilane gas. The epitaxial growth of the silicon layer on the carbon-free or carbon pile-up free silicon substrate surface results in the epitaxial silicon layer having a high crystal quality or crystal perfection.

The sixth present invention provides a method of epitaxially growing a silicon layer on a silicon substrate surface. The silicon substrate surface is cleaned with a first chemical including ammonia, hydrogen peroxide and water to remove organic substances and particles from the silicon substrate surface. The silicon substrate surface is further cleaned with a second chemical including hydrochloric acid, hydrogen peroxide and water to remove heavy metals. The silicon substrate surface is furthermore cleaned with a diluted hydrofluoric acid solution to remove a spontaneous oxide layer from the silicon substrate surface. A carbon-contaminated layer on the silicon substrate surface is exposed to a hydrogen radical, wherein a Temperature of the silicon substrate surface is maintained to be not more than 800° C., to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by a epitaxial growth of a silicon layer on the silicon substrate surface by use of a silane system gas including a silane gas and a disilane gas without, however, heating the silicon substrate surface up to a high temperature of, for example, not less than about 800° C. to eliminate residual hydrogen from the silicon substrate surface. This means it possible to remove carbon or the carbon-contaminated layer from the silicon substrate surface at such desirable low temperature. Further, the hydrogen radical has been generated by passing a hydrogen gas through a filament, heated up so that the hydrogen radical is generated at a much higher generation efficiency than when the hydrogen radical were generated by using a deep ultraviolet ray This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

The seventh present invention provides an apparatus for epitaxially growing a silicon layer on a silicon substrate. The apparatus comprises the following elements. A growth chamber is adopted for accommodating the silicon substrate and epitaxially growing the silicon layer on the silicon substrate. A temperature controller is further provided in the growth chamber for controlling a temperature of the silicon substrate. A gas supplier is provided to be connected to the growth chamber for supplying a silane system gas including a silane gas and a disilane gas into the growth chamber for epitaxial growth of the silicon layer on the silicon substrate. A radical generator is furthermore provided to be connected to the growth chamber for generating one selected from the group consisting of a chlorine radical and a hydrogen radical and supplying the selected one of the chlorine radical and the hydrogen radical onto the silicon substrate in the growth chamber, wherein the radical generator is provided with a filament and a heater for heating the filament and so adopted that one of a chlorine gas and a hydrogen gas is passed through the filament, heated up to cause a dissociation of the one of the chlorine gas and the hydrogen gas to generate the selected one of the chlorine radical and the hydrogen radical. The epitaxial growth of the silicon layer on the carbon-free or carbon pile-up free silicon substrate surface results in the epitaxial silicon layer having a high crystal quality or crystal perfection.

BRIEF DESCRIPTION OF THE DRAWINGS

Preferred embodiments of the present invention will be described in detail with reference to the accompanying drawings.

DISCLOSURE OF THE INVENTION

Figure 1:
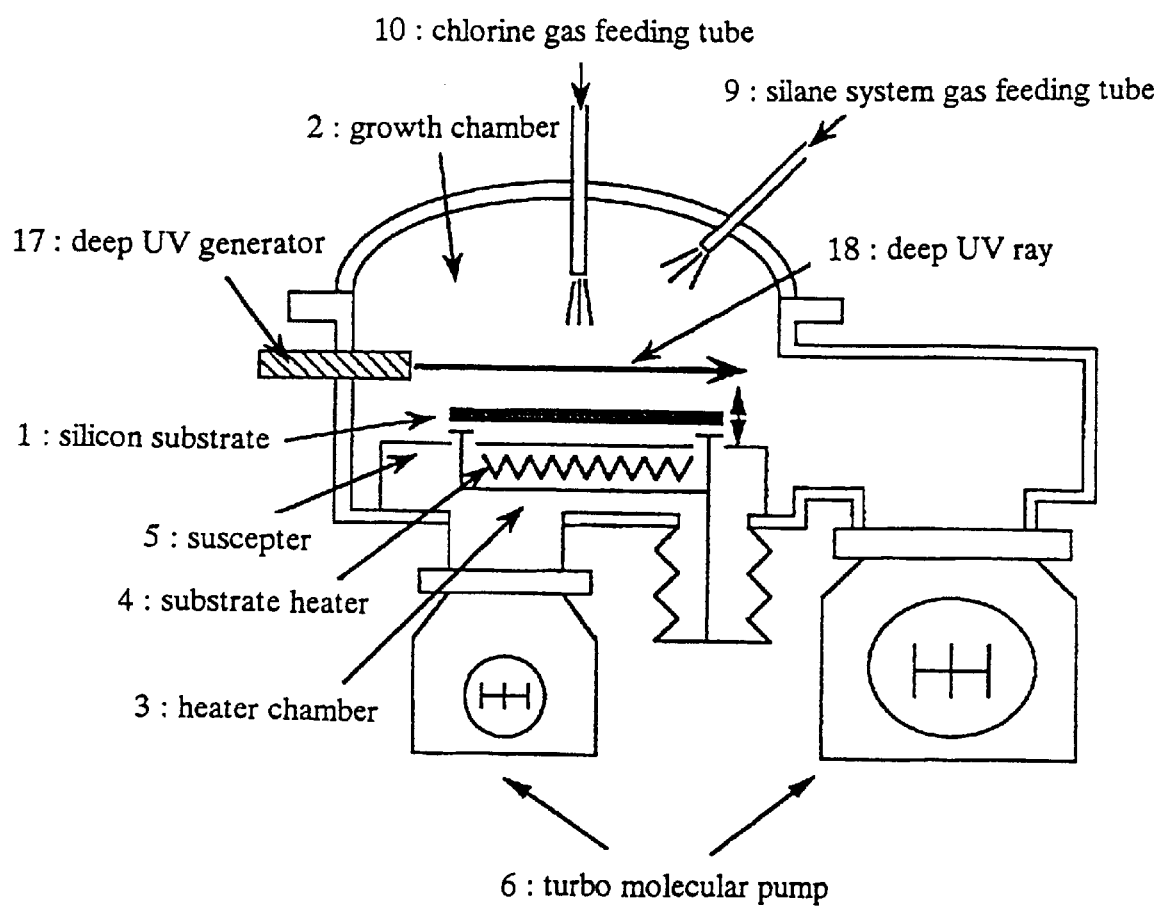
FIG. 1 is a schematic diagram illustrative of a structure of the conventional silicon epitaxial growth system provided with a deep ultraviolet ray generator for generating chlorine radical to remove carbon contamination.

The first present invention relates to a method of removing a carbon-contaminated layer from a silicon substrate surface before a silicon epitaxial growth on the silicon substrate surface. A carbon-contaminated layer on the silicon substrate surface is exposed to a chlorine radical to cause a chemical reaction of the chlorine radical with carbon atoms of the carbon-contaminated layer to generate chlorine carbide to form chlorine carbide for removal of the carbon-contaminated layer from the silicon substrate surface, wherein the chlorine radical has been generated by passing a chlorine gas through a filament, heated up so that the chlorine radical is generated at a much higher generation efficiency than when the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

It is preferable that a temperature of the silicon substrate surface is maintained to be not more than 800° C. during exposure of the carbon-contaminated layer to the chlorine radical. This means it possible to remove carbon or the carbon-contaminated layer from the silicon substrate surface at such desirable low temperature.

It is also preferable that the chlorine radical is irradiated by maintaining the silicon substrate surface at a temperature of about 650° C.

It is also preferable that after the chlorine radical is irradiated onto the carbon-contaminated layer, the silicon substrate surface is heated up to a temperature of not less than about 800° C. to eliminate residual chlorine from the silicon substrate surface before the silicon epitaxial growth on the silicon substrate surface. This means it possible to remove carbon or the carbon-contaminated layer from the silicon substrate surface at such desirable low temperature. In this case, it is more preferable to cool the silicon substrate surface down to a temperature of about 650° C. for the subsequent silicon epitaxial growth.

It is optionally possible that the filament is heated up to a temperature of about 2000° C. In this case, it is preferable that the chlorine gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is preferable that the silicon substrate surface is cleaned with a diluted hydrofluoric acid solution to remove a spontaneous oxide layer from the silicon substrate surface for subsequent exposure of the carbon-contaminated layer to the chlorine radical.

It is available that the silicon epitaxial growth is carried out by use of a silane system gas including a silane gas and a disilane gas.

It is optionally available that after commencement of the exposure of the carbon-contaminated layer to the chlorine radical, the silicon substrate surface is heated up to a temperature of about 650° C. and then maintained at the temperature before discontinuation of the exposure.

The second present invention provides a method of removing a carbon-contaminated layer from a silicon substrate surface before a silicon epitaxial growth on the silicon substrate surface. A carbon-contaminated layer on the silicon substrate surface is exposed to a hydrogen radical to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by the subsequent silicon epitaxial growth without, however, heating the silicon substrate surface up to a high temperature of, for example, not less than about 800° C. to eliminate residual hydrogen from the silicon substrate surface. Further, the hydrogen radical has been generated by passing a hydrogen gas through a filament heated up so that the hydrogen radical is generated at a much higher generation efficiency than if the hydrogen radical were generated by using a deep ultraviolet ray. This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

It is preferable that a temperature of the silicon substrate surface is maintained to be not more than 800° C. during exposure of the carbon-contaminated layer to the hydrogen radical. This means it possible to remove carbon or the carbon-contaminated layer from the silicon substrate surface at such desirable low temperature. In this case, it is further preferable that the hydrogen radical is irradiated by maintaining the silicon substrate surface at a temperature of about 650° C.

It is also preferable that the hydrogen radical is irradiated onto the carbon-contaminated layer for subsequent silicon epitaxial growth.

It is optional that the filament is heated up to a temperature of about 2000° C. In this case, it is preferable that the hydrogen gas flows through the filament at a flow rate in the range of 4–20 sccm. Notwithstanding, the temperature of the filament heated and the source gas flow rate are variable match various conditions and requirements. Not only tungsten but also other metals are available for the filament material. The filament is variable in size and shape to match various conditions and requirements.

It is possible that the silicon substrate surface is cleaned with a diluted hydrofluoric acid solution to remove a spontaneous oxide layer from the silicon substrate surface for subsequent exposure of the carbon-contaminated layer to the hydrogen radical.

It is preferable that the silicon epitaxial growth is carried out by use of a silane system gas including a silane gas and a disilane gas.

It is also preferable that after commencement of the exposure of the carbon-contaminated layer to the hydrogen radical, the silicon substrate surface is heated up to a temperature of about 650° C. and then maintained at the temperature before discontinuation of the exposure.

The third present invention provides a method of removing a carbon-contaminated layer from a silicon substrate surface for subsequent silicon epitaxial growth on the silicon substrate surface. A carbon-contaminated layer on the silicon substrate surface is exposed to a chlorine radical, wherein a temperature of the silicon substrate surface is maintained to be not more than 800° C., to cause a reaction of the chlorine radical with carbon atoms of the carbon-contaminated layer to form chlorine carbide for removal of the carbon-contaminated layer from the silicon substrate surface. This means it possible to remove carbon or the carbon-contaminated layer from the silicon substrate surface at such desirable low temperature. The epitaxial growth of the silicon layer on the carbon-free or carbon pile-up free silicon substrate surface results in the epitaxial silicon layer having a high crystal quality or crystal perfection.

It is preferable that the chlorine radical has been generated by passing a chlorine gas through a filament heated up so that the chlorine radical is generated at a much higher generation efficiency than if the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

It is also preferable that the filament is heated up to a temperature of about 2000° C. In this case, it is further preferable that the chlorine gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is also preferable that the chlorine radical is irradiated onto the carbon-contaminated layer on the silicon substrate surface.

It is also preferable that the chlorine radical is irradiated by maintaining the silicon substrate surface at a temperature of about 650° C.

It is optionally possible that the silicon substrate surface is cleaned with a diluted hydrofluoric acid solution to remove a spontaneous oxide layer from the silicon substrate surface for subsequent exposure of the carbon-contaminated layer to the chlorine radical.

It is preferable that the silicon epitaxial growth is carried out by use of a silane system gas including a silane gas and a disilane gas.

It is optionally available that after commencement of the exposure of the carbon-contaminated layer to the chlorine radical, the silicon substrate surface is heated up to a temperature of about 650° C. and then maintained at the temperature before discontinuation of the exposure.

The fourth present invention provides a method of removing a carbon-contaminated layer from a silicon substrate surface for subsequent silicon epitaxial growth on the silicon substrate surface. A carbon-contaminated layer on the silicon substrate surface is exposed to a hydrogen radical, wherein a temperature of the silicon substrate surface is maintained to be not more than 800° C., to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by the subsequent silicon epitaxial growth without, however, heating the silicon substrate surface up to a high temperature of, for example, not less than about 800° C. to eliminate residual hydrogen from the silicon substrate surface. This means it possible to remove carbon or the carbon-contaminated layer from the silicon substrate surface at such desirable low temperature. The epitaxial growth of the silicon layer on the carbon-free or carbon pile-up free silicon substrate surface results in the epitaxial silicon layer having a high crystal quality or crystal perfection.

It is preferable that the hydrogen radical has been generated by passing a hydrogen gas through a filament heated up so that the hydrogen radical is generated at a much higher generation efficiency than when the hydrogen radical were generated by using a deep ultraviolet ray. This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

It is optional that the filament is heated up to a temperature of about 2000° C. In this case, it is preferable that the hydrogen gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is possible that the hydrogen radical is irradiated onto the carbon-contaminated layer on the silicon substrate surface.

It is preferable that the hydrogen radical is irradiated by maintaining the silicon substrate surface at a temperature of about 650° C.

It is further possible that the silicon substrate surface is cleaned with a diluted hydrofluoric acid solution to remove a spontaneous oxide layer from the silicon substrate surface for subsequent exposure of the carbon-contaminated layer to the hydrogen radical.

It is preferable that the silicon epitaxial growth is carried out by use of a silane system gas including a silane gas and a disilane gas.

It is optionally available that after commencement of the exposure of the carbon-contaminated layer to the hydrogen radical, the silicon substrate surface is heated up to a temperature of about 650° C. and then maintained at the temperature before discontinuation of the exposure.

The fifth present invention provides a method of epitaxially growing a silicon layer on a silicon substrate surface. The silicon substrate surface is cleaned with a first chemical including ammonia, hydrogen peroxide and water to remove organic substances and particles from the silicon substrate surface. The silicon substrate surface is further cleaned with a second chemical including hydrochloric acid, hydrogen peroxide and water to remove heavy metals. The silicon substrate surface is furthermore cleaned with a diluted hydrofluoric acid solution to remove a spontaneous oxide layer from the silicon substrate surface. A carbon-contaminated layer on the silicon substrate surface is exposed to a chlorine radical, wherein a temperature of the silicon substrate surface is maintained to be not more than 800° C., to cause a reaction of the chlorine radical with carbon atoms of the carbon-contaminated layer to form chlorine carbide for removal of the carbon-contaminated layer from the silicon substrate surface. This means it possible to remove carbon or the carbon-contaminated layer from the silicon substrate surface at such desirable low temperature. Further, the chlorine radical has been generated by passing a chlorine gas through a filament heated up so that the chlorine radical is generated at a much higher generation efficiency than if the chlorine radical were generated by using a deep ultraviolet ray. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency. The silicon substrate surface is heated up to a temperature of more than about 800° C. to eliminate residual chlorine from the silicon substrate surface. The silicon substrate surface is cooled down to a temperature of about 650° C. A silicon layer is epitaxially grown on the silicon substrate surface by use of a silane system gas including a silane gas and a disilane gas. The epitaxial growth of the silicon layer on the carbon-free or carbon pile-up free silicon substrate surface results in the epitaxial silicon layer having a high crystal quality or crystal perfection.

It is preferable that the chlorine radical is irradiated onto the carbon-contaminated layer on the silicon substrate surface.

It is more preferable that the chlorine radical is irradiated by maintaining the silicon substrate surface at a temperature of about 650° C.

It is optional that the filament is heated up to a temperature of about 2000° C. In this case, it is preferable that the chlorine gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is possible that the first chemical is rinsed with a pure water before cleaning the silicon substrate surface with the second chemical.

It is also possible that the second chemical is rinsed with a pure water before cleaning the silicon substrate surface with the diluted hydrofluoric acid solution.

It is also possible that after commencement of the exposure of the carbon-contaminated layer to the chlorine radical, the silicon substrate is heated up to a temperature of about 650° C. and then maintained at the temperature before discontinuation of the exposure.

The sixth present invention provides a method of epitaxially growing a silicon layer on a silicon substrate surface. The silicon substrate surface is cleaned with a first chemical including ammonia, hydrogen peroxide and water to remove organic substances and particles from the silicon substrate surface. The silicon substrate surface is further cleaned with a second chemical including hydrochloric acid, hydrogen peroxide and water to remove heavy metals. The silicon substrate surface is furthermore cleaned with a diluted hydrofluoric acid solution to remove a spontaneous oxide layer from the silicon substrate surface. A carbon-contaminated layer on the silicon substrate surface is exposed to a hydrogen radical, wherein a temperature of the silicon substrate surface is maintained to be not more than 800° C., to cause a reaction of the hydrogen radical with carbon atoms of the carbon-contaminated layer to form hydrocarbon for removal of the carbon-contaminated layer from the silicon substrate surface and spontaneous elimination of hydrogen from the silicon substrate surface followed by a epitaxial growth of a silicon layer on the silicon substrate surface by use of a silane system gas including a silane gas and a disilane gas without, however, heating the silicon substrate surface up to a high temperature of, for example, not less than about 800° C. to eliminate residual hydrogen from the silicon substrate surface. This means it possible to remove carbon or the carbon-contaminated layer from the silicon substrate surface at such desirable low temperature. Further, the hydrogen radical has been generated by passing a hydrogen gas through a filament heated up so that the hydrogen radical is generated at a much higher generation efficiency than when the hydrogen radical were generated by using a deep ultraviolet ray. This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency. The epitaxial growth of the silicon layer on the carbon-free or carbon pile-up free silicon substrate surface results in the epitaxial silicon layer having a high crystal quality or crystal perfection.

It is preferable that the hydrogen radical is irradiated onto the carbon-contaminated layer on the silicon substrate surface.

It is more preferable that the hydrogen radical is irradiated by maintaining the silicon substrate surface at a temperature of about 650° C.

It is optional that the filament is heated up to a temperature of about 2000° C. In this case, it is preferable that the hydrogen gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is possible that the first chemical is rinsed with a pure water before cleaning the silicon substrate surface with the second chemical.

It is also possible that the second chemical is rinsed with a pure water before cleaning the silicon substrate surface with the diluted hydrofluoric acid solution.

It is optionally available that after commencement of the exposure of the carbon-contaminated layer to the hydrogen radical, the silicon substrate surface is heated up to a temperature of about 650° C. and then maintained at the temperature before discontinuation of the exposure.

The seventh present invention provides an apparatus for epitaxially growing a silicon layer on a silicon substrate. The apparatus comprises the following elements. A growth chamber is adopted for accommodating the silicon substrate and epitaxially growing the silicon layer on the silicon substrate. A temperature controller is further provided in the growth chamber for controlling a temperature of the silicon substrate. A gas supplier is provided to be connected to the growth chamber for supplying a silane system gas including a silane gas and a disilane gas into the growth chamber for epitaxial growth of the silicon layer on the silicon substrate. A radical generator is furthermore provided to be connected to the growth chamber for generating one selected from the group consisting of a chlorine radical and a hydrogen radical and supplying the selected one of the chlorine radical and the hydrogen radical onto the silicon substrate in the growth chamber, wherein the radical generator is provided with a filament and a heater for heating the filament and so adopted that one of a chlorine gas and a hydrogen gas is passed through the filament heated up to cause a dissociation of the one of the chlorine gas and the hydrogen gas to generate the selected one of the chlorine radical and the hydrogen radical. The epitaxial growth of the silicon layer on the carbon-free or carbon pile-up free silicon substrate surface results in the epitaxial silicon layer having a high crystal quality or crystal perfection.

It is possible that the heater is adopted to heat the filament up to a temperature of about 2000° C. In this case, it is preferable that the hydrogen gas flows through the filament at a flow rate in the range of 4–20 sccm. Notwithstanding, the temperature of the filament heated and the source gas flow rate are variable to match various conditions and requirements. Not only tungsten but also other metals are available for the filament material. The filament is variable in size and shape to match various conditions and requirements.

It is optional that the filament is provided at an end of a gas feeding tube for feeding the selected one of the chlorine gas and the hydrogen gas.

It is possible that the temperature controller comprises a substrate heater for heating the silicon substrate. In this case, it is preferable that the substrate heater is adopted to maintain a temperature of the silicon substrate at a temperature of not more than 800° C. This means it possible to remove carbon or the carbon-contaminated layer from the silicon substrate surface at such desirable low temperature.

It is also possible that the radical generator is positioned over the silicon substrate for irradiating the selected one of the chlorine radical and the hydrogen radical downwardly onto the silicon substrate.

PREFERRED EMBODIMENTS

Figure 2:
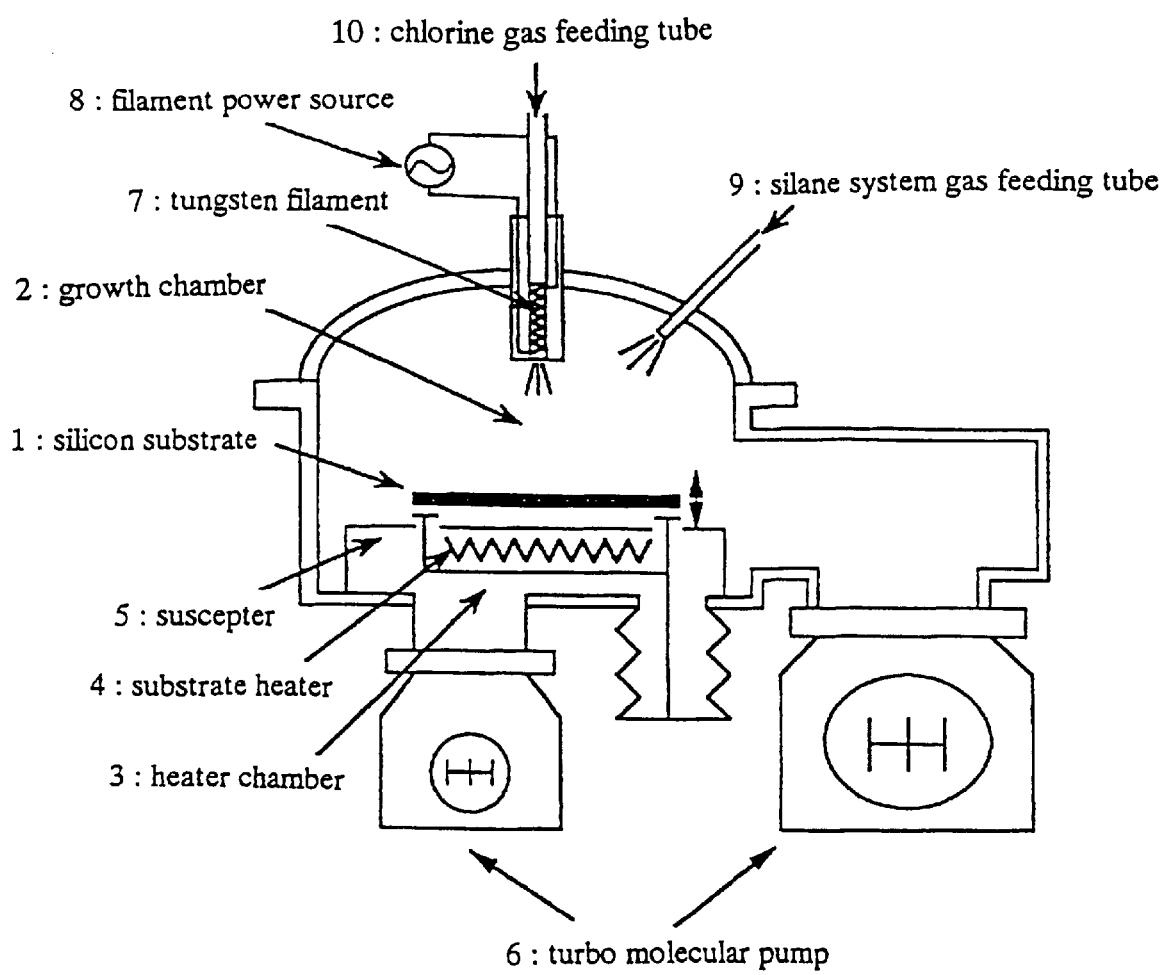
FIG. 2 is a schematic diagram illustrative of a structure of a novel silicon epitaxial growth system provided with a filament generator for generating chlorine radical to remove carbon contamination in a first embodiment according to the present invention.

A first embodiment according to the present invention will be described which provides a novel silicon epitaxial growth system provided with a filament generator for generating chlorine radical to remove carbon contamination from a silicon substrate surface. FIG. 2 is a schematic diagram illustrative of a structure of a novel silicon epitaxial growth system provided with a filament generator for generating chlorine radical to remove carbon contamination in a first embodiment according to the present invention.

The silicon epitaxial growth system comprises the following elements. A growth chamber 2 is adopted for accommodating a silicon substrate 1 and epitaxially growing a silicon layer on the silicon substrate 1. A heater chamber 3 is provided adjacent to the growth chamber 2 so that the heater chamber 3 is positioned under the silicon substrate 1, whilst the growth chamber 2 is positioned over the silicon substrate 1. Namely, the heater chamber 3 is separated by the silicon substrate 1 from the growth chamber 2. In the heater chamber 3, a substrate heater 4 serving as a substrate temperature controller is provided for controlling a temperature of the silicon substrate 1 or heating up the silicon substrate 1. In the growth chamber 2, the silicon substrate 1 is supported by a suscepter 5. A pair of turbo molecular pumps 6 are provided which are coupled with the growth chamber 2 and the heater chamber 3 respectively for differential discharge. A silane system gas feeding tube 9 is provided to be connected to the growth chamber 2 for supplying a silane system gas such as a silane gas and a disilane gas into the growth chamber 2 for epitaxial growth of the silicon layer on the silicon substrate 1. A chlorine radical generator is furthermore provided to be connected to the growth chamber 2 for generating a chlorine radical and supplying the chlorine radical onto the silicon substrate 1 in the growth chamber 2. The chlorine radical generator comprises a chlorine gas feeding tube 10, through which a chlorine gas is fed, a filament 7 made of tungsten provided in a bottom portion of the chlorine gas feeding tube 10 so that the chlorine gas is fed from via the filament 7 into the growth chamber 2. The chlorine radical generator further comprises a filament power source 8 for applying ac power to the filament 7 to heat the filament 7 up to a high temperature, for example, 2000° C. The chlorine radical generator is, therefore, adopted so that a chlorine gas is passed through the filament 7 and heated up to cause a dissociation of the chlorine gas to generate the chlorine radical at a high efficiency, for example, about 10% whereby the chlorine radical is fed into the growth chamber 2. The chlorine radical generator is positioned over the silicon substrate 1. Namely, chlorine gas feeding tube 10 is provided, which extends vertically and the filament 7 is provided in the bottom portion of the chlorine gas feeding tube 10 so that the chlorine radical is injected downwardly and toward the silicon substrate 1 whereby the chlorine radical is irradiated onto the silicon substrate 1. On the other hand, the silane system gas feeding tube 9 is provided at an oblique angle to the surface of the silicon substrate 1 so that the silane system gas is injected into the growth chamber 2 at the oblique angle to the surface of the silicon substrate 1.

A carbon-contaminated layer on the silicon substrate 1 is, therefore, exposed to the chlorine radical, wherein a temperature of the silicon substrate 1 is maintained to be not more than 800° C. by the substrate heater 4, to cause a reaction of the chlorine radical with carbon atoms of the carbon-contaminated layer to form chlorine carbide for removal of the carbon-contaminated layer from the silicon substrate 1. This means it possible to remove carbon or the carbon-contaminated layer from the silicon substrate 1 at such desirable low temperature. Further, the chlorine radical has been generated by passing the chlorine gas through the filament 7 heated up by the filament power source 8 so that the chlorine radical is generated at a much higher generation efficiency, for example, about 10% as compared to a generation efficiency of 0.5% to be obtained if the chlorine radical were generated by using a deep ultraviolet ray. This means that the use of the filament 7 for generating the chlorine radical at the higher generation efficiency results in a larger amount of the chlorine radical to be irradiated onto the carbon-contaminated layer and then reacted with carbon atoms to generate chlorine carbide at the above higher efficiency whereby carbon on the silicon substrate surface or the carbon-contaminated layer may completely be removed therefrom at the above higher efficiency. Thereafter, the silicon layer is epitaxially grown on the silicon substrate 1 by use of the silane system gas such as the silane gas and the disilane gas fed through the silane system gas feeding tube 9. The epitaxial growth of the silicon layer on the carbon-free or carbon pile-up free silicon substrate surface results in the epitaxial silicon layer having a high crystal quality or crystal perfection.

Figure 4:
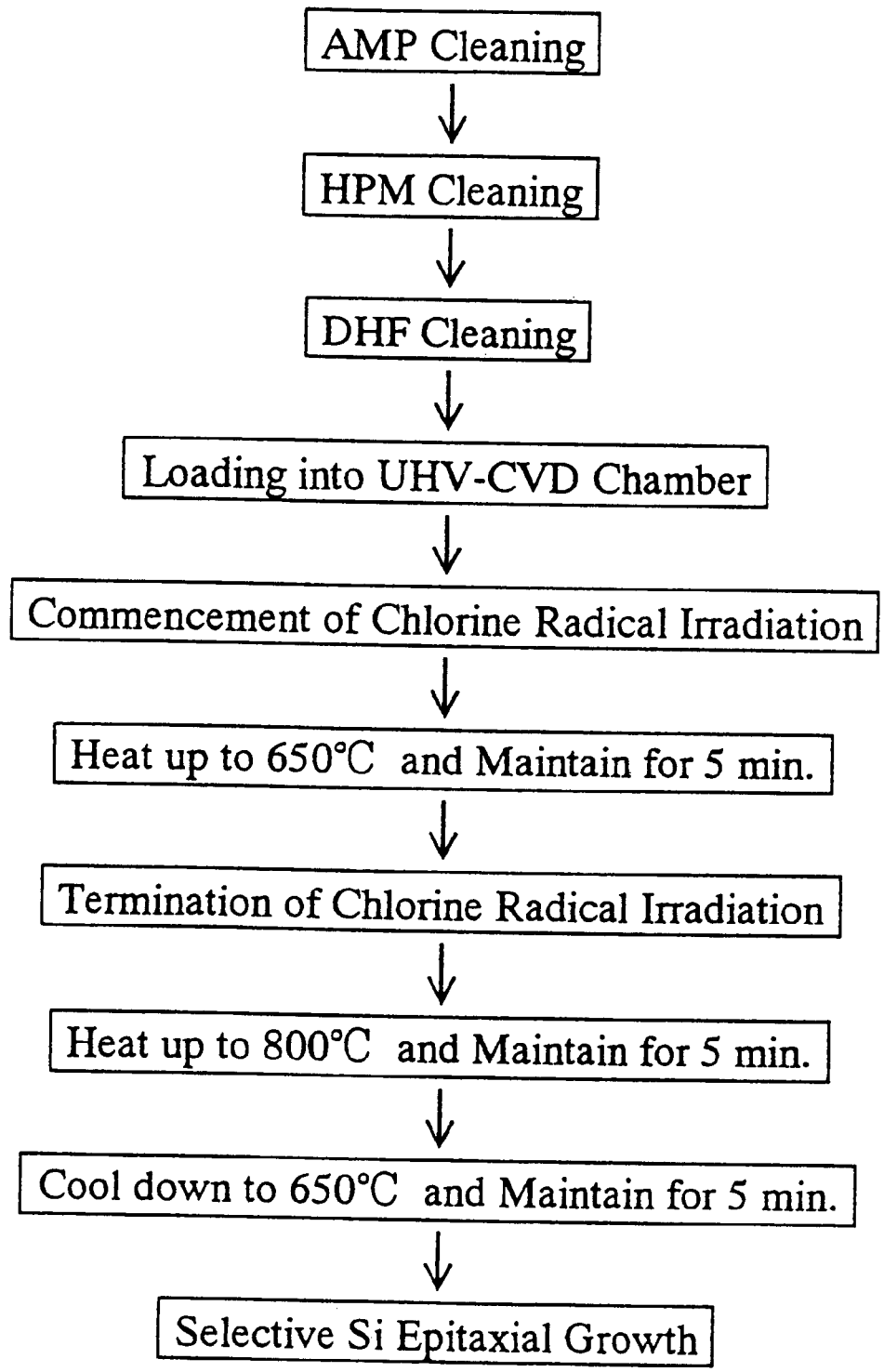
FIG. 4 is a flow chart describing a method of removing a carbon-contaminated layer from a silicon substrate surface by a chlorine radical before a silicon epitaxial growth on the silicon substrate surface in a first embodiment according to the present invention.

FIG. 4 is a flow chart describing a method of removing a carbon-contaminated layer from a silicon substrate surface by a chlorine radical before a silicon epitaxial growth on the silicon substrate surface in a first embodiment according to the present invention.

A silicon substrate is prepared and then a silicon oxide film is formed on the silicon substrate. Openings are partially formed in the silicon oxide film. In detail, a silicon substrate was prepared, which has a diameter of 150 mm and a (100) face. This silicon substrate is subjected to a wet oxidation at a temperature of 1000° C. to form a thermal oxide film having a thickness of 2000 angstroms on the surface of the silicon substrate. This silicon substrate is then subjected to a photolithography and a subsequent wet etching which is carried out by using a 17%-buffered hydrofluoric acid so as to form an opening pattern in the silicon oxide film. A ratio in area of the opening portion to the silicon oxide film is 10%. Subsequently, the processes are carried out as illustrated in FIG. 4.

An AMP cleaning is carried out at a temperature of 70° C. for 10 minutes. Namely, the silicon substrate surface is cleaned with a first chemical including ammonia, hydrogen peroxide and water to remove organic substances and particles from the silicon substrate surface. The silicon substrate surface is rinsed with a pure water for 10 minutes to remove the first chemical from the silicon substrate surface.

An HPM cleaning is then carried out at a temperature of 70° C. for 10 minutes. Namely, the silicon substrate surface is further cleaned with a second chemical including hydrochloric acid, hydrogen peroxide and water to remove heavy metals. The silicon substrate surface is rinsed with a pure water for 10 minutes to remove the second chemical from the silicon substrate surface.

A DHF cleaning is then carried out for 1 minute. Namely, the silicon substrate surface is furthermore cleaned with a diluted hydrofluoric acid solution to remove a spontaneous oxide layer from the silicon substrate surface. The silicon substrate surface is rinsed with a pure water for 2 minutes to remove the diluted hydrofluoric acid solution from the silicon substrate surface. The silicon substrate surface is dried by a riser dryer before loading the same into the ultra high vacuum growth chamber 2 illustrated in FIG. 2. The growth chamber is adapted to have a pressure of $1\times10^{-9}$ torr. When the silicon substrate 1 is loaded into the growth chamber 2, then carbon atoms are adhered onto the surface of the silicon substrate 1. Namely, the silicon substrate surface is contaminated with carbon whereby a carbon-contaminated layer is formed over the silicon substrate 1.

The tungsten filament 7 is heated up to a temperature of 2000° C. The chlorine gas flows through the chlorine gas feeding tube 10 and the filament 7 at a flow rate in the range of 4–20 sccm to form chlorine radical at a high generation efficiency of about 10%.

The carbon-contaminated layer on the silicon substrate surface is exposed to the chlorine radical. Namely, the chlorine radical is irradiated onto the silicon substrate surface so as to cause a reaction of the chlorine radical with carbon atoms of the carbon-contaminated layer to form chlorine carbide for etching and removing the carbon-contaminated layer from the silicon substrate surface. After commencement of the irradiation of the chlorine radical, the silicon substrate 1 is heated up to a temperature of 650° C. and then maintained at that temperature for 5 minutes before the feeding of the chlorine gas through the chlorine gas feeding tube 10 is discontinued to terminate the irradiation of the chlorine radical onto the silicon substrate 1.

As described above, the chlorine radical has been generated by passing a chlorine gas through the filament 7 heated up to 2000° C. so that the chlorine radical is generated at a much higher generation efficiency of about 10% than a low generation efficiency of 0.5% resulted from if the chlorine radical were generated by using the deep ultraviolet ray as used in the prior art. This means that the use of the filament for generating the chlorine radical at the higher generation efficiency results in a larger amount of the chlorine radical to be irradiated onto the carbon-contaminated layer and then reacted with carbon atoms to generate chlorine carbide at a higher efficiency whereby carbon on the silicon substrate surface or the carbon-contaminated layer may be removed therefrom at a higher efficiency.

Thereafter, the silicon substrate is heated up to a temperature of more than about 800° C. and then maintained at that temperature for 5 minutes to eliminate residual chlorine from the silicon substrate surface. The silicon substrate surface is then cooled down to a temperature of 650° C. and then maintained at that temperature for 5 minutes.

A disilane gas is fed through the silane system gas feeding tube 9 into the growth chamber 2 at a source gas flow rate of 2 sccm under a disilane partial gas pressure of $5 \times 10^{-5}$ torr so that a silicon layer is epitaxially grown on the carbon-free or carbon pile-up free silicon substrate surface resulting in the epitaxial silicon layer having a high crystal quality or crystal perfection.

Figure 6:
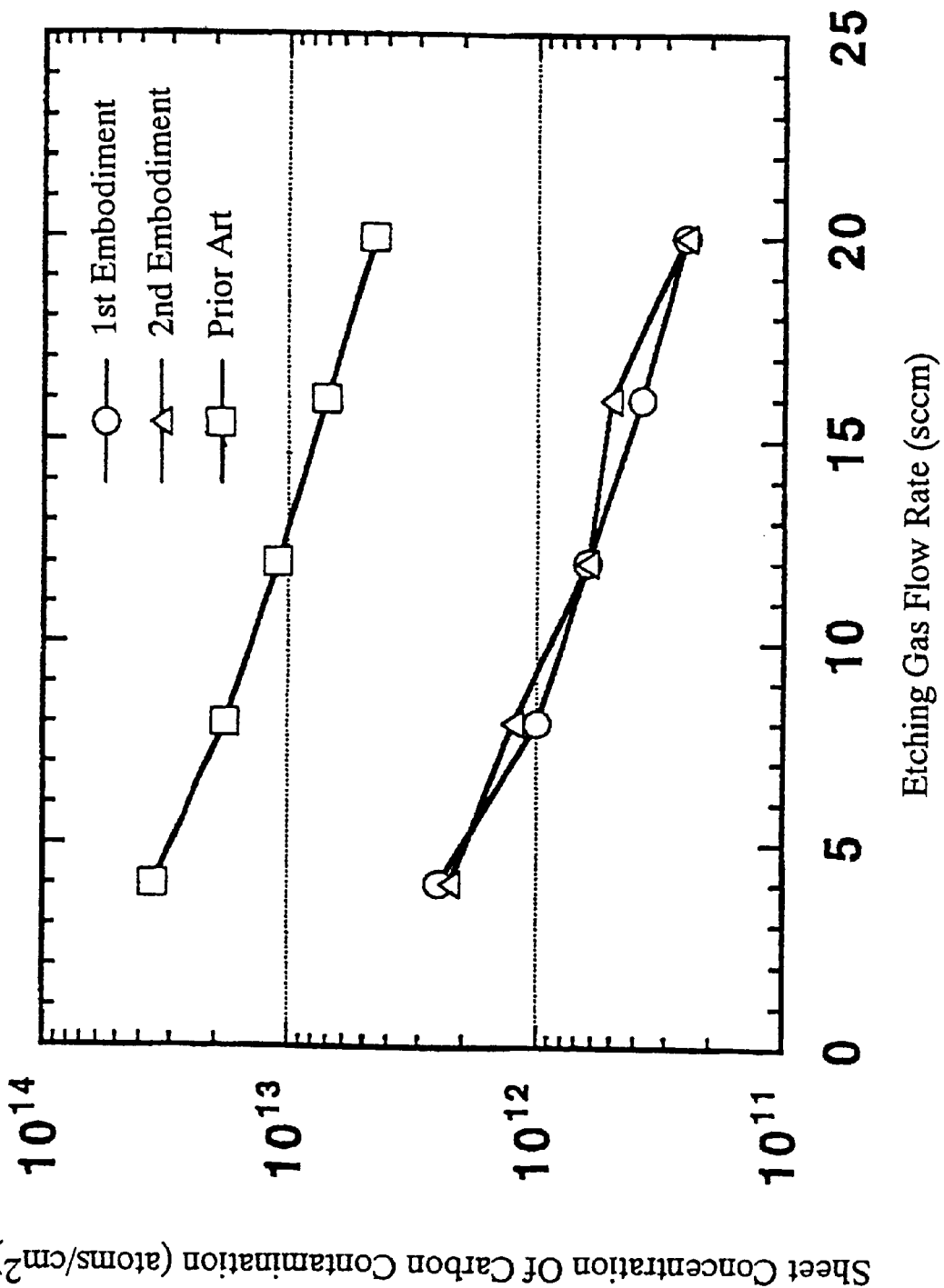
FIG. 6 is a diagram illustrative of variations in sheet concentration of an interface carbon contamination versus etching gas flow rate measured by a secondary ion mass spectroscopy method in the prior art and first and second embodiments according to the present invention.

FIG. 6 is a diagram illustrative of variations in sheet concentration of an interface carbon contamination versus etching gas flow rate measured by a secondary ion mass spectroscopy method after the chlorine and hydrogen radical irradiation process in the prior art and first and second embodiments according to the present invention. The sheet concentration is calculated by an integration of pile-up on the silicon substrate interface over the depth profile so that the calculated sheet concentration of carbon contamination is regarded to be the degree of the carbon contamination. Both in the prior art and the first embodiment of the present invention, as the chlorine gas flow rate is increased, then the degree of the carbon contamination is reduced. The sheet concentration of the carbon contamination after irradiation of the chlorine radical generated by the filament 7 heated in accordance with the present invention is only one twentieth or less of that when the chlorine radical generated by the deep ultraviolet ray in accordance with the prior art method. This large difference in sheet concentration of the carbon contamination resulted from the large difference in generation efficiency of the chlorine radical between the high efficiency of 10% when the filament 7 is used and the low efficiency of 0.5% when the deep ultraviolet ray is used.

Figure 7A:
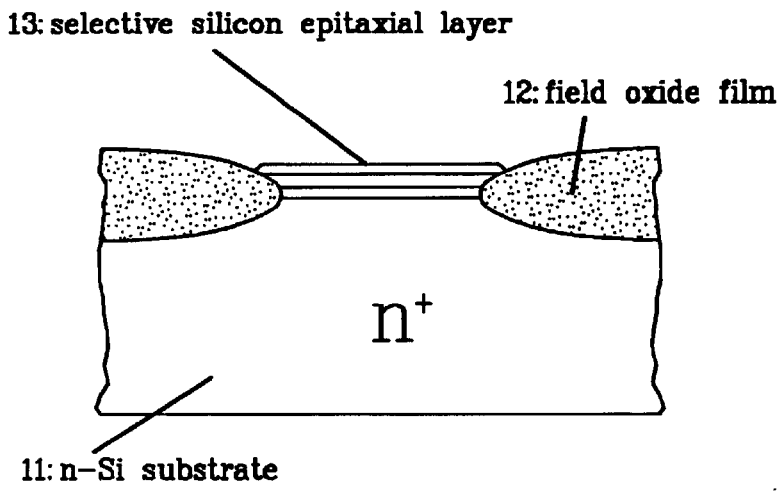
FIGS. 7A through 7C are fragmentary cross sectional elevation views illustrated in a semiconductor device having a selective silicon epitaxial layer involved in a method of fabricating test element group (TEG) for evaluation of crystal quality of the silicon epitaxial layer.
Figure 7B:
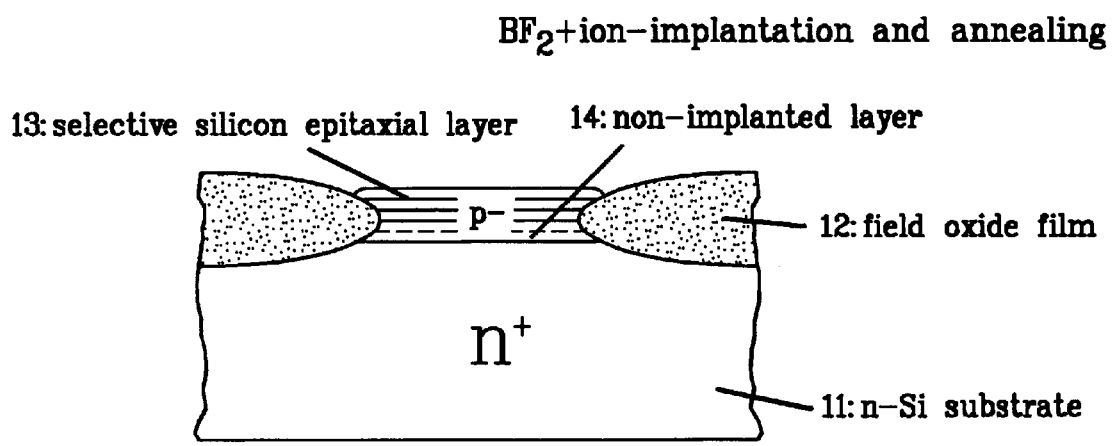
Figure 7C:
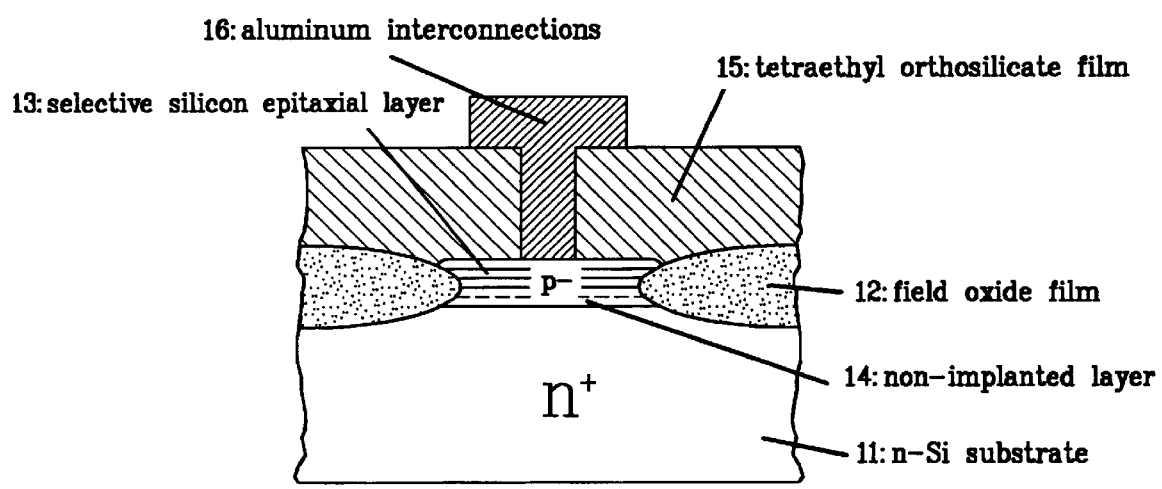

FIGS. 7A through 7C are fragmentary cross sectional elevation views illustrated in a semiconductor device having a selective silicon epitaxial layer involved in a method of fabricating test element group (TEG) for evaluation of crystal quality of the silicon epitaxial layer.

With reference to FIG. 7A, an antimony-doped n-type silicon substrate 11 is prepared, which has a (100) face and a resistivity of about 10 Ω cm. Field oxide films 12 are selectively formed over the substrate 11. In accordance with the above method, a chlorine gas flows at 20 sccm for generation of the chlorine radical and irradiation thereof onto the silicon substrate surface before the epitaxial silicon layer 13 having a thickness of 1000 angstroms is selectively grown on the silicon substrate 11.

With reference to FIG. 7B, $BF^{2+}$ ion is implanted at an energy of 30 keV. The substrate 11 is then subjected to a rapid thermal annealing at a temperature of 1000° C. for 10 minutes to activate the impurity to form an ion-implanted layer 14.

With reference to FIG. 7C, a TEOS film 15 having a thickness of 5000 angstroms is formed over the substrate 11 before a contact hole is made in the TEOS film 15 by the photo-lithography. An aluminum interconnection 16 is then formed by sputtering aluminum and subsequent photo-lithography.

Figure 8:
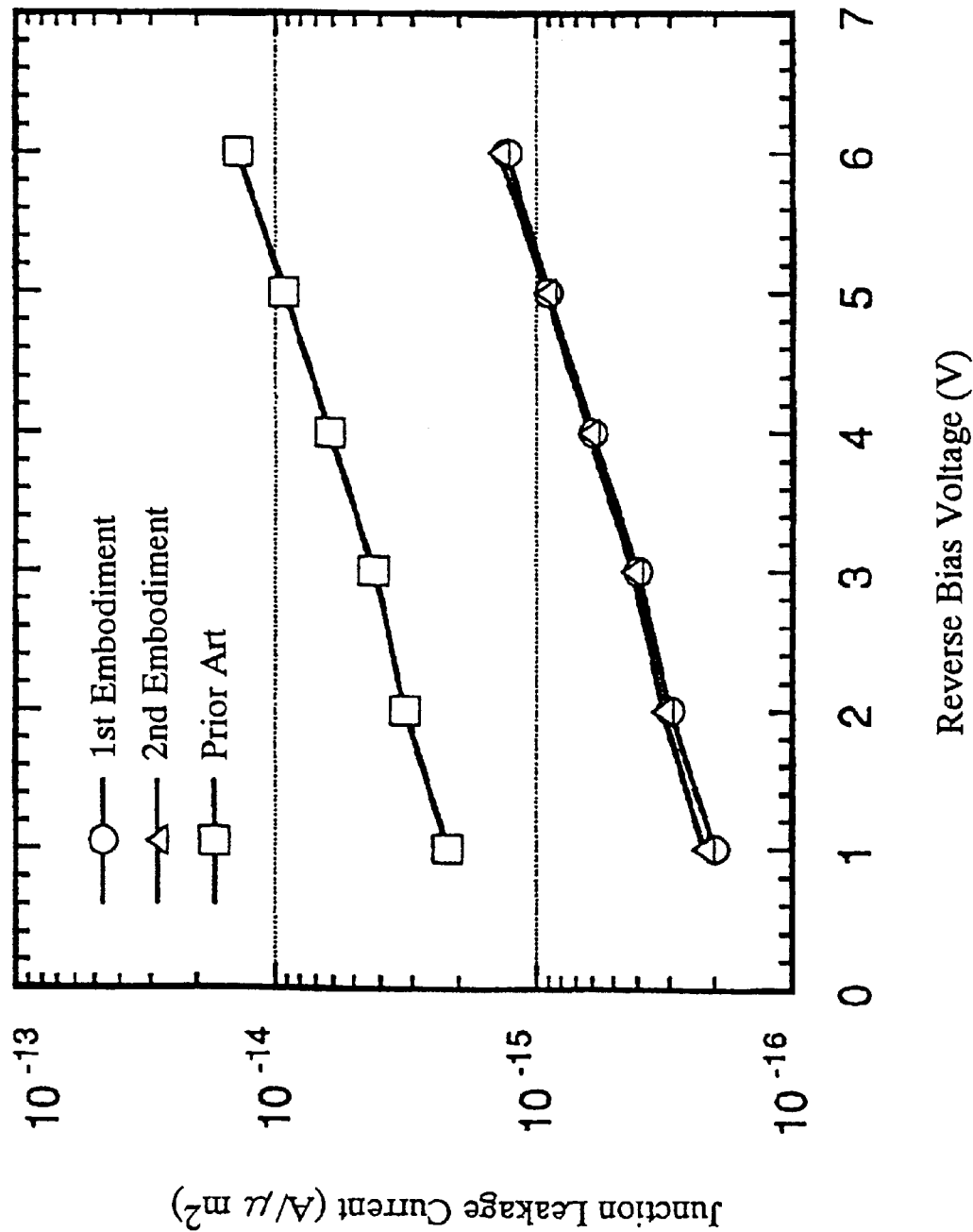
FIG. 8 is a diagram illustrative of variation in junction leakage current versus reverse bias voltage of the semiconductor device as test element group (TEG) for evaluation of crystal quality of the silicon epitaxial layer.

FIG. 8 is a diagram illustrative of variation in junction leakage current versus reverse bias voltage of the semiconductor device as test element group (TEG) for evaluation of crystal quality of the silicon epitaxial layer. The junction leakage current when the filament was used to generate the chlorine radical in the first embodiment is only one tenth of that when the deep ultraviolet ray is used to generate the chlorine radical in the prior art. This demonstrates that the silicon epitaxial layer formed by the above method in the first embodiment according to the present invention has a much higher crystal quality than that when formed in the prior art method. This resulted from the above fact that the sheet concentration of the carbon contamination after irradiation of the chlorine radical generated by the filament 7 heated is only one twentieth or less of that when the chlorine radical generated by the deep ultraviolet ray.

Figure 3:
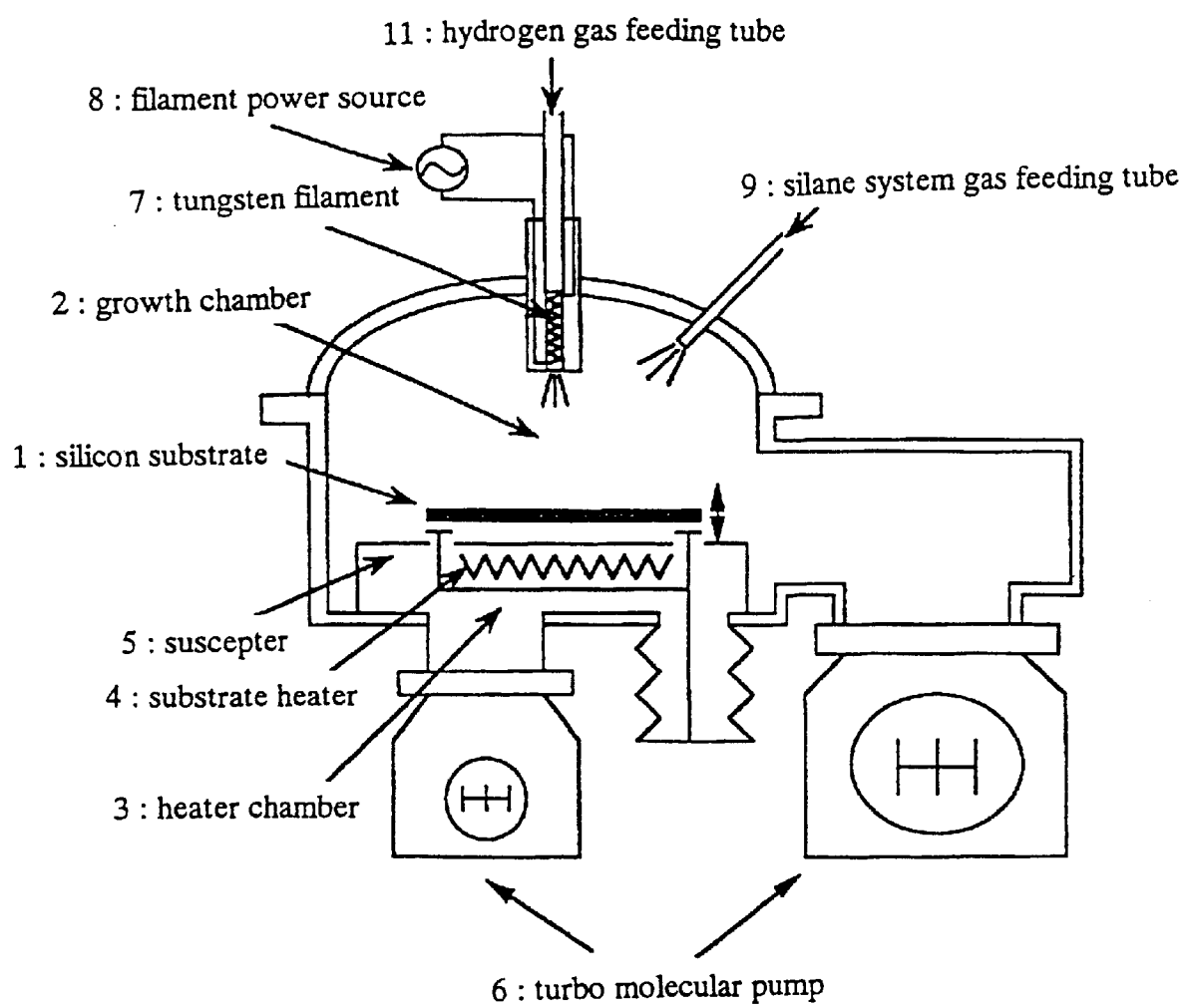
FIG. 3 is a schematic diagram illustrative of a structure of a novel silicon epitaxial growth system provided with a filament generator for generating hydrogen radical to remove carbon contamination in a second embodiment according to the present invention.

A second embodiment according to the present invention will be described which provides a novel silicon epitaxial growth system provided with a filament generator for generating hydrogen radical to remove carbon contamination from a silicon substrate surface. FIG. 3 is a schematic diagram illustrative of a structure of a novel silicon epitaxial growth system provided with a filament generator for generating hydrogen radical to remove carbon contamination in a second embodiment according to the present invention.

The silicon epitaxial growth system comprises the following elements. A growth chamber 2 is adopted for accommodating a silicon substrate 1 and epitaxially growing a silicon layer on the silicon substrate 1. A heater chamber 3 is provided adjacent to the growth chamber 2 so that the heater chamber 3 is positioned under the silicon substrate 1, whilst the growth chamber 2 is positioned over the silicon substrate 1. Namely, the heater chamber 3 is separated by the silicon substrate 1 from the growth chamber 2. In the heater chamber 3, a substrate heater 4 serving as a substrate temperature controller is provided for controlling a temperature of the silicon substrate 1 or heating up the silicon substrate 1. In the growth chamber 2, the silicon substrate 1 is supported by a suscepter 5. A pair of turbo molecular pumps 6 are provided which are coupled with the growth chamber 2 and the heater chamber 3 respectively for differential discharge. A silane system gas feeding tube 9 is provided to be connected to the growth chamber 2 for supplying a silane system gas such as a silane gas and a disilane gas into the growth chamber 2 for epitaxial growth of the silicon layer on the silicon substrate 1. A hydrogen radical generator is furthermore provided to be connected to the growth chamber 2 for generating a hydrogen radical and supplying the hydrogen radical onto the silicon substrate 1 in the growth chamber 2. The hydrogen radical generator comprises a hydrogen gas feeding tube 11, through which a hydrogen gas is fed, a filament 7 made of tungsten provided in a bottom portion of the hydrogen gas feeding tube 11 so that the hydrogen gas is fed from via the filament 7 into the growth chamber 2. The hydrogen radical generator further comprises a filament power source 8 for applying ac power to the filament 7 to heat the filament 7 up to a high temperature, for example, 2000° C. The hydrogen radical generator is, therefore, adopted so that a hydrogen gas is passed through the filament 7 and heated up to cause a dissociation of the hydrogen gas to generate the hydrogen radical at a high efficiency whereby the hydrogen radical is fed into the growth chamber 2. The hydrogen radical generator is positioned over the silicon substrate 1. Namely, a hydrogen gas feeding tube 11 is provided, which extends vertically and the filament 7 is provided in the bottom portion of the hydrogen gas feeding tube 11 so that the hydrogen radical is injected downwardly and toward the silicon substrate 1 whereby the hydrogen radical is irradiated onto the silicon substrate 1. On the other hand, the silane system gas feeding tube 9 is provided at an oblique angle to the surface of the silicon substrate 1 so that the silane system gas is injected into the growth chamber 2 at the oblique angle to the surface of the silicon substrate 1.

A carbon-contaminated layer on the silicon substrate 1 is, therefore, exposed to the hydrogen radical, wherein a temperature of the silicon substrate 1 is maintained to be not more than 800° C. by the substrate heater 4, to cause a reaction of the hydrogen radical with carbon atoms of the carbon-contaminated layer to form hydrocarbon for removal of the carbon-contaminated layer from the silicon substrate 1. This means it possible to remove carbon or the carbon-contaminated layer from the silicon substrate 1 at such desirable low temperature. Further, the hydrogen radical has been generated by passing the hydrogen gas through the filament 7 heated up by the filament power source 8 so that the hydrogen radical is generated at a much higher generation efficiency as compared to a generation efficiency of 0.5% to be obtained if the hydrogen radical were generated by using a deep ultraviolet ray. This means that the use of the filament 7 for generating the hydrogen radical at the higher generation efficiency results in a larger amount of the hydrogen radical to be irradiated onto the carbon-contaminated layer and then reacted with carbon atoms to generate hydrogen carbide at the above higher efficiency whereby carbon on the silicon substrate surface or the carbon-contaminated layer may completely be removed therefrom at the above higher efficiency. Thereafter, the silicon layer is epitaxially grown on the silicon substrate 1 by use of the silane system gas such as the silane gas and the disilane gas fed through the silane system gas feeding tube 9. The epitaxial growth of the silicon layer on the carbon-free or carbon pile-up free silicon substrate surface results in the epitaxial silicon layer having a high crystal quality or crystal perfection.

Figure 5:
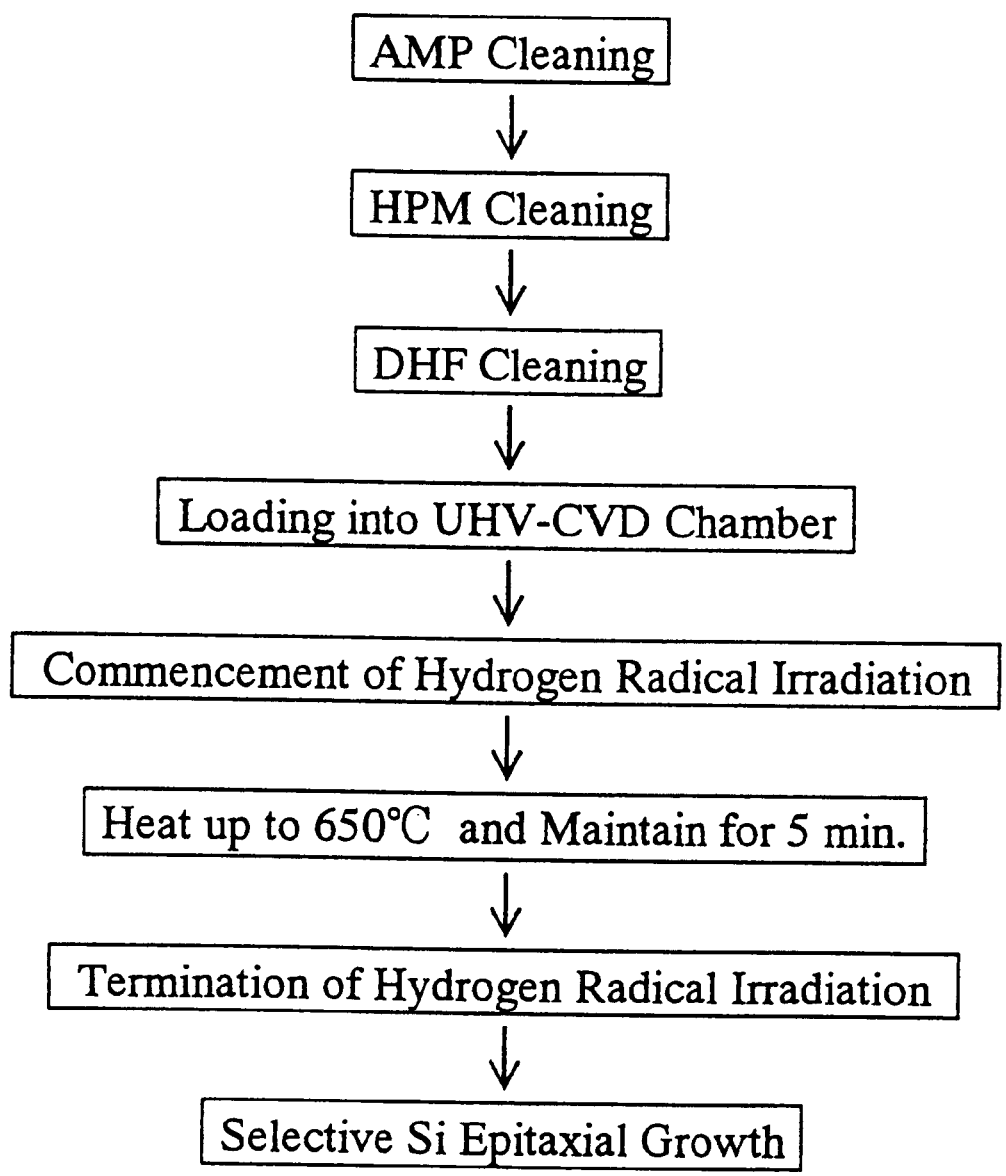
FIG. 5 is a flow chart describing a method of removing a carbon-contaminated layer from a silicon substrate surface by a hydrogen radical before a silicon epitaxial growth on the silicon substrate surface in a second embodiment according to the present invention.

FIG. 5 is a flow chart describing a method of removing a carbon-contaminated layer from a silicon substrate surface by a hydrogen radical before a silicon epitaxial growth on the silicon substrate surface in a second embodiment according to the present invention.

A silicon substrate is prepared and then a silicon oxide film is formed on the silicon substrate. Openings are partially formed in the silicon oxide film. In detail, a silicon substrate was prepared, which has a diameter of 150 mm and a (100) face. This silicon substrate is subjected to a wet oxidation at a temperature of 1000° C. to form a thermal oxide film having a thickness of 2000 angstroms on the surface of the silicon substrate. This silicon substrate is then subjected to a photolithography and a subsequent wet etching which is carried out by using a 17%-buffered hydrofluoric acid so as to form an opening pattern in the silicon oxide film. A ratio in area of the opening portion to the silicon oxide film is 10%. Subsequently, the processes are carried out as illustrated in FIG. 5.

An AMP cleaning is carried out at a temperature of 70° C. for 10 minutes. Namely, the silicon substrate surface is cleaned with a first chemical including ammonia, hydrogen peroxide and water to remove organic substances and particles from the silicon substrate surface. The silicon substrate surface is rinsed with a pure water for 10 minutes to remove the first chemical from the silicon substrate surface.

An HPM cleaning is then carried out at a temperature of 70° C. for 10 minutes. Namely, the silicon substrate surface is further cleaned with a second chemical including hydrochloric acid, hydrogen peroxide and water to remove heavy metals. The silicon substrate surface is rinsed with a pure water for 10 minutes to remove the second chemical from the silicon substrate surface.

A DHF cleaning is then carried out for 1 minute. Namely, the silicon substrate surface is furthermore cleaned with a diluted hydrofluoric acid solution to remove a spontaneous oxide layer from the silicon substrate surface. The silicon substrate surface is rinsed with a pure water for 2 minutes to remove the diluted hydrofluoric acid solution from the silicon substrate surface. The silicon substrate surface is dried by a riser dryer before loading the same into the growth chamber 2 illustrated in FIG. 2. The growth chamber is adopted to have a pressure of $1 \times 10^{-9}$ torr. When the silicon substrate 1 is loaded into the growth chamber 2, then carbon atoms are adhered onto the surface of the silicon substrate 1 Namely, the silicon substrate surface is contaminated with carbon whereby a carbon-contaminated layer is formed over the silicon substrate 1.

The tungsten filament 7 is heated up to a temperature of 2000° C. The hydrogen gas flows through the hydrogen gas feeding tube 10 and the filament 7 at a flow rate in the range of 4–20 sccm to form hydrogen radical at a high generation efficiency of about 10%.

The carbon-contaminated layer on the silicon substrate surface is exposed to the hydrogen radical. Namely, the hydrogen radical is irradiated onto the silicon substrate surface so as to cause a reaction of the hydrogen radical with carbon atoms of the carbon-contaminated layer to form hydrogen carbide for etching and removing the carbon-contaminated layer from the silicon substrate surface. After commencement of the irradiation of the hydrogen radical, the silicon substrate 1 is heated up to a temperature of 650° C. and then maintained at that temperature for 5 minutes before the feeding of the hydrogen gas through the hydrogen gas feeding tube 10 is discontinued to terminate the irradiation of the hydrogen radical onto the silicon substrate 1.

As described above, the hydrogen radical has been generated by passing a hydrogen gas through the filament 7 heated up to 2000° C. so that the hydrogen radical is generated at a much higher generation efficiency of about 10% than a low generation efficiency of 0.5% resulted from if the hydrogen radical were generated by using the deep ultraviolet ray as used in the prior art. This means that the use of the filament for generating the hydrogen radical at the higher generation efficiency results in a larger amount of the hydrogen radical to be irradiated onto the carbon-contaminated layer and then reacted with carbon atoms to generate hydrocarbon at a higher efficiency whereby carbon on the silicon substrate surface or the carbon-contaminated layer may be removed therefrom at a higher efficiency.

Differently from when the chlorine radical is used, all of the hydrogen radicals are spontaneously eliminated from the silicon substrate surface without, however, further heating up to the silicon substrate. Namely, a silicon epitaxial growth process follows the termination of the hydrogen radical irradiation process.

A disilane gas is fed through the silane system gas feeding tube 9 into the growth chamber 2 at a source gas flow rate of 2 sccm under a disilane partial gas pressure of $5 \times 10^{-5}$ torr so that a silicon layer is epitaxially grown on the carbon-free or carbon pile-up free silicon substrate surface resulting in the epitaxial silicon layer having a high crystal quality or crystal perfection.

FIG. 6 is a diagram illustrative of variations in sheet concentration of an interface carbon contamination versus etching gas flow rate measured by a secondary ion mass spectroscopy method after the chlorine and hydrogen radical irradiation process in the prior art and first and second embodiments according to the present invention. The sheet concentration is calculated by an integration of pile-up on the silicon substrate interface over the depth profile so that the calculated sheet concentration of carbon contamination is regarded to be the degree of the carbon contamination. Both in the prior art and the first embodiment of the present invention, as the hydrogen gas flow rate is increased, then the degree of the carbon contamination is reduced. The sheet concentration of the carbon contamination after irradiation of the hydrogen radical generated by the filament 7 heated in accordance with the present invention is only one twentieth or less of that when the hydrogen radical generated by the deep ultraviolet ray in accordance with the prior art method. This large difference in sheet concentration of the carbon contamination resulted from the large difference in generation efficiency of the hydrogen radical between the high efficiency of 10% when the filament 7 is used and the low efficiency of 0.5% when the deep ultraviolet ray is used.

FIGS. 7A through 7C are fragmentary cross sectional elevation views illustrated in a semiconductor device having a selective silicon epitaxial layer involved in a method of fabricating test element group (TEG) for evaluation of crystal quality of the silicon epitaxial layer.

With reference to FIG. 7A, an antimony-doped n-type silicon substrate 11 is prepared, which has a (100) face and a resistivity of about 10 Ω cm. Field oxide films 12 are selectively formed over the substrate 11. In accordance with the above method, a hydrogen gas flows at 20 sccm for generation of the hydrogen radical and irradiation thereof onto the silicon substrate surface before the epitaxial silicon layer 13 having a thickness of 1000 angstroms is selectively grown on the silicon substrate 11.

With reference to FIG. 7B, $BF^{2+}$ ion is implanted at an energy of 30 keV. The substrate 11 is then subjected to a rapid thermal annealing at a temperature of 1000° C. for 10 minutes to activate the impurity to form an ion-implanted layer 14.

With reference to FIG. 7C, a TEOS film 15 having a thickness of 5000 angstroms is formed over the substrate 11 before a contact hole is made in the TEOS film 15 by the photo-lithography. An aluminum interconnection 16 is then formed by sputtering aluminum and subsequent photo-lithography.

FIG. 8 is a diagram illustrative of variation in junction leakage current versus reverse bias voltage of the semiconductor device as test element group (TEG) for evaluation of crystal quality of the silicon epitaxial layer. The junction leakage current when the filament was used to generate the hydrogen radical in the first embodiment is only one tenth of that when the deep ultraviolet ray is used to generate the hydrogen radical in the prior art. This demonstrates that the silicon epitaxial layer formed by the above method in the first embodiment according to the present invention has a much higher crystal quality than that when formed in the prior art method. This resulted from the above fact that the sheet concentration of the carbon contamination after irradiation of the hydrogen radical generated by the filament 7 heated is only one twentieth or less of that when the hydrogen radical generated by the deep ultraviolet ray.

Whereas modifications of the present invention will be apparent to a person having ordinary skill in the art, to which the invention pertains, it is to be understood that embodiments as shown and described by way of illustrations are by no means intended to be considered in a limiting sense, accordingly, it is to be intended to cover by claims any modifications of the present invention which fall within the spirit and scope of the present invention.

What is claimed is:

1. A method of removing a carbon-contaminated layer from a silicon substrate surface before a silicon epitaxial growth on the silicon substrate surface, the method comprising the step of:

exposing a carbon-contaminated layer on the silicon substrate surface to a chlorine radical to cause a reaction of the chlorine radical with carbon atoms of the carbon-contaminated layer for removal of the carbon-contaminated layer from the silicon substrate surface, wherein the chlorine radical has been generated by passing a chlorine gas through a heated filament.

2. The method as claimed in claim 1, wherein a temperature of the silicon substrate surface is maintained to be not more than 800° C. during exposure of the carbon-contaminated layer to the chlorine radical.

3. The method as claimed in claim 1, wherein the chlorine radical is irradiated while maintaining the silicon substrate surface at a temperature of about 650° C.

4. The method as claimed in claim 1, further comprising the step of, after the chlorine radical is irradiated onto the carbon-contaminated layer, heating the silicon substrate surface up to a temperature of not less than about 800° C. to eliminate residual chlorine from the silicon substrate surface before the silicon epitaxial growth on the silicon substrate surface.

5. The method as claimed in claim 4, further comprising the step of cooling the silicon substrate surface down to a temperature of about 650° C. for the subsequent silicon epitaxial growth.

6. The method as claimed in claim 1, wherein the filament is heated up to a temperature of about 2000° C.

7. The method as claimed in claim 6, wherein the chlorine gas flows through the filament at a flow rate in the range of 4–20 sccm.

8. The method as claimed in claim 1, farther comprising the step of cleaning the silicon substrate surface with a diluted hydrofluoric acid solution to remove a spontaneous oxide layer from the silicon substrate surface for subsequent exposure of the carbon-contaminated layer to the chlorine radical.

9. The method as claimed in claim 1, wherein the silicon epitaxial growth is carried out by use of a silane system gas.

10. The method as claimed in claim 1, wherein, after commencement of the exposure of the carbon-contaminated layer to the chlorine radical, the silicon substrate surface is heated to a temperature of about 650° C. and then maintained at the temperature before discontinuation of the exposure.

11. The method of claim 1, wherein the generation of the chlorine radicals by passing a chlorine gas through a heated filament further comprises the step of utilizing a chlorine radical generator comprising a chlorine gas feeding tube, and a heated filament locating in a bottom portion of the chlorine gas feeding tube, the chlorine radical generator designed and adapted to feed chlorine gas into the feeding tube and around the heated filament to dissociate the chlorine gas and generate the chlorine radicals exiting the chlorine radical generator.

12. A method of removing a carbon-contaminated layer from a silicon substrate surface before a silicon epitaxial growth on the silicon substrate surface, the method comprising the step of:

exposing a carbon-contaminated layer on the silicon substrate surface to a hydrogen radical to cause a reaction of the hydrogen radical with carbon atoms of the carbon-contaminated layer for removal of the carbon-contaminated layer from the silicon substrate surface and spontaneous elimination of hydrogen from the silicon substrate surface followed by the subsequent silicon epitaxial growth, wherein the hydrogen radical has been generated by passing a hydrogen gas through a heated filament.

13. The method as claimed in claim 12, wherein a temperature of the silicon substrate surface is maintained to be not more than 800° C. during exposure of the carbon-contaminated layer to the hydrogen radical.

14. The method as claimed in claim 13, wherein the hydrogen radical is irradiated while maintaining the silicon substrate surface at a temperature of about 650° C.

15. The method as claimed in claim 12, wherein the hydrogen radical is irradiated onto the carbon-contaminated layer for subsequent silicon epitaxial growth.

16. The method as claimed in claim 12, wherein the filament is heated to a temperature of about 2000° C.

17. The method as claimed in claim 16, wherein the hydrogen gas flows through the filament at a flow rate in the range of 4–20 sccm.

18. The method as claimed in claim 12, further comprising the step of cleaning the silicon substrate surface with a diluted hydrofluoric acid solution to remove a spontaneous oxide layer from the silicon substrate surface for subsequent exposure of the carbon-contaminated layer to the hydrogen radical.

19. The method as claimed in claim 12, wherein the silicon epitaxial growth is carried out by use of a silane system gas.

20. The method as claimed in claim 12, wherein, after commencement of the exposure of the carbon-contaminated layer to the hydrogen radical, the silicon substrate surface is heated to a temperature of about 650° C. and then maintained at the temperature before discontinuation of the exposure.

21. The method of claim 12, wherein the generation of the hydrogen radicals by passing a hydrogen gas through a heated filament further comprises the step of utilizing a hydrogen radical generator comprising a hydrogen gas feeding tube, and a heated filament locating in a bottom portion of the hydrogen gas feeding tube, the hydrogen radical generator designed and adapted to feed hydrogen gas into the feeding tube and around the heated filament to dissociate the hydrogen gas and generate the hydrogen radicals exiting the hydrogen radical generator.

22. A method of removing a carbon-contaminated layer from a silicon substrate surface for subsequent silicon epitaxial growth on the silicon substrate surface, the method comprising the step of:

exposing a carbon-contaminated layer on the silicon substrate surface, within an ultra high vacuum chamber, to a chlorine radical, wherein a temperature of the silicon substrate surface is maintained to be not more than 800° C., to cause a reaction of the chlorine radical with carbon atoms of the carbon-contaminated layer for removal of the carbon-contaminated layer from the silicon substrate surface, wherein the chlorine radical has been generated by passing a chlorine gas through a heated filament.

23. The method as claimed in claim 22, wherein the filament is heated to a temperature of about 2000° C.

24. The method as claimed in claim 23, wherein the chlorine gas flows through the filament at a flow rate in the range of 4–20 sccm.

25. The method as claimed in claim 22, wherein the chlorine radical is irradiated onto the carbon-contaminated layer on the silicon substrate surface.

26. The method as claimed in claim 22, wherein the chlorine radical is irradiated by maintaining the silicon substrate surface at a temperature of about 650° C.

27. The method as claimed in claim 22, further comprising the step of cleaning the silicon substrate surface with a diluted hydrofluoric acid solution to remove a spontaneous oxide layer from the silicon substrate surface for subsequent exposure of the carbon-contaminated layer to the chlorine radical.

28. The method as claimed in claim 22, wherein the silicon epitaxial growth is carried out by use of a silane system gas.

29. The method as claimed in claim 22, wherein, after commencement of the exposure of the carbon-contaminated layer to the chlorine radical, the silicon substrate surface is heated to a temperature of about 650° C. and then maintained at the temperature before discontinuation of the exposure.

30. The method as claimed in claim 22, wherein said ultra high vacuum is about $1 \times 10^{-9}$ Torr.

31. A method of removing a carbon-contaminated layer from a silicon substrate surface for subsequent silicon epitaxial growth on the silicon substrate surface, the method comprising the step of:

exposing a carbon-contaminated layer on the silicon substrate surface, within an ultra high vacuum chamber, to a hydrogen radical, wherein a temperature of the silicon substrate surface is maintained to be not more than 800° C., to cause a reaction of the hydrogen radical with carbon atoms of the carbon-contaminated layer for removal of the carbon-contaminated layer from the silicon substrate surface and spontaneous elimination of hydrogen from the silicon substrate surface followed by the subsequent silicon epitaxial growth, wherein the hydrogen radical has been generated by passing a hydrogen gas through a heated filament.

32. The method as claimed in claim 31, wherein the filament is heated to a temperature of about 2000° C.

33. The method as claimed in claim 32, wherein the hydrogen gas flows through the filament at a flow rate in the range of 4–20 sccm.

34. The method as claimed in claim 31, wherein the hydrogen radical is irradiated onto the carbon-contaminated layer on the silicon substrate surface.

35. The method as claimed in claim 31, wherein the hydrogen radical is irradiated by maintaining the silicon substrate surface at a temperature of about 650° C.

36. The method as claimed in claim 31, further comprising the step of cleaning the silicon substrate surface with a diluted hydrofluoric acid solution to remove a spontaneous oxide layer from the silicon substrate surface for subsequent exposure of the carbon-contaminated layer to the hydrogen radical.

37. The method as claimed in claim 31, wherein the silicon epitaxial growth is carried out by use of a silane system gas.

38. The method as claimed in claim 31, wherein, after commencement of the exposure of the carbon-contaminated layer to the hydrogen radical, the silicon substrate surface is heated to a temperature of about 650° C. and then maintained at the temperature before discontinuation of the exposure.

39. The method as claimed in claim 31, wherein said ultra high vacuum is about $1 \times 10^{-9}$ Torr.

40. A method of epitaxially growing a silicon layer on a silicon substrate surface, the method comprising the steps of:
cleaning the silicon substrate surface with a first chemical including ammonia, hydrogen peroxide and water to remove organic substances and particles from the silicon substrate surface;
cleaning the silicon substrate surface with a second chemical including hydrochloric acid, hydrogen peroxide and water to remove heavy metals;
cleaning the silicon substrate surface with a diluted hydrofluoric acid solution to remove a spontaneous oxide layer from the silicon substrate surface;
exposing a carbon-contaminated layer on the silicon substrate surface to a chlorine radical, wherein a temperature of the silicon substrate surface is maintained to be not more than 800° C., to cause a reaction of the chlorine radical with carbon atoms of the carbon-contaminated layer for removal of the carbon-contaminated layer from the silicon substrate surface, the chlorine radical having been generated by passing a chlorine gas through a heated filament;
heating the silicon substrate surface up to a temperature of more than about 800° C. to eliminate residual chlorine from the silicon substrate surface;
cooling the silicon substrate surface down to a temperature of about 650° C.; and
epitaxially growing a silicon layer on the silicon substrate surface by use of a silane system gas.

41. The method as claimed in claim 40, wherein the chlorine radical is irradiated onto the carbon-contaminated layer on the silicon substrate surface.

42. The method as claimed in claim 40, wherein the chlorine radical is irradiated by maintaining the silicon substrate surface at a temperature of about 650° C.

43. The method as claimed in claim 40, wherein the filament is heated to a temperature of about 2000° C.

44. The method as claimed in claim 43, wherein the chlorine gas flows through the filament at a flow rate in the range of 4–20 sccm.

45. The method as claimed in claim 40, further comprising the step of rinsing the first chemical with a pure water before cleaning the silicon substrate surface with the second chemical.

46. The method as claimed in claim 40, further comprising the step of rinsing the second chemical with a pure water before cleaning the silicon substrate surface with the diluted hydrofluoric acid solution.

47. The method as claimed in claim 40, wherein, after commencement of the exposure of the carbon-contaminated layer to the chlorine radical, the silicon substrate is heated to a temperature of about 650° C. and then maintained at the temperature before discontinuation of the exposure.

48. A method of epitaxially growing a silicon layer on a silicon substrate surface, the method comprising the steps of:
cleaning the silicon substrate surface with a first chemical including ammonia, hydrogen peroxide and water to remove organic substances and particles from the silicon substrate surface;
cleaning the silicon substrate surface with a second chemical including hydrochloric acid, hydrogen peroxide and water to remove heavy metals;
cleaning the silicon substrate surface with a diluted hydrofluoric acid solution to remove a spontaneous oxide layer from the silicon substrate surface; and
exposing a carbon-contaminated layer on the silicon substrate surface to a hydrogen radical, wherein a temperature of the silicon substrate surface is maintained to be not more than 800° C., to cause a reaction of the hydrogen radical with carbon atoms of the carbon-contaminated layer for removal of the carbon-contaminated layer from the silicon substrate surface and spontaneous elimination of hydrogen from the silicon substrate surface followed by a epitaxial growth of a silicon layer on the silicon substrate surface by use of a silane system gas, wherein the hydrogen radical has been generated by passing a hydrogen gas through a heated filament.

49. The method as claimed in claim 48, wherein the hydrogen radical is irradiated onto the carbon-contaminated layer on the silicon substrate surface.

50. The method as claimed in claim 48, wherein the hydrogen radical is irradiated by maintaining the silicon substrate surface at a temperature of about 650° C.

51. The method as claimed in claim 48, wherein the filament is heated to a temperature of about 2000° C.

52. The method as claimed in claim 51, wherein the hydrogen gas flows through the filament at a flow rate in the range of 4–20 sccm.

53. The method as claimed in claim 48, further comprising the step of rinsing the first chemical with a pure water before cleaning the silicon substrate surface with the second chemical.

54. The method as claimed in claim 48, further comprising the step of rinsing the second chemical with a pure water before cleaning the silicon substrate surface with the diluted hydrofluoric acid solution.

55. The method as claimed in claim 48, wherein, after commencement of the exposure of the carbon-contaminated layer to the hydrogen radical, the silicon substrate surface is heated to a temperature of about 650° C. and then maintained at the temperature before discontinuation of the exposure.

\* \* \* \* \*